(12) United States Patent
Popov et al.

(10) Patent No.: US 12,543,519 B2
(45) Date of Patent: Feb. 3, 2026

(54) VAPOR DEPOSITION PROCESSES AND A DEPOSITION ASSEMBLY

(71) Applicant: ASM IP Holding, B.V., Almere (NL)

(72) Inventors: Georgi Popov, Helsinki (FI); Alexander Weiss, Vantaa (FI); Mikko Ritala, Espoo (FI); Marianna Kemell, Helsinki (FI)

(73) Assignee: ASM IP Holding B.V., Almere (NL)

( * ) Notice: Subject to any disclaimer, the term of this patent is extended or adjusted under 35 U.S.C. 154(b) by 446 days.

(21) Appl. No.: 18/162,454

(22) Filed: Jan. 31, 2023

(65) Prior Publication Data
US 2023/0245899 A1 Aug. 3, 2023

Related U.S. Application Data

(60) Provisional application No. 63/306,250, filed on Feb. 3, 2022.

(51) Int. Cl.
*H01L 21/3205* (2006.01)
(52) U.S. Cl.
CPC .............. *H01L 21/32051* (2013.01)
(58) Field of Classification Search
CPC ................................. H01L 21/32051
See application file for complete search history.

(56) References Cited

U.S. PATENT DOCUMENTS

| | | | |
|---|---|---|---|
| 2013/0068953 A1 | 3/2013 | Keiko | |
| 2015/0122316 A1* | 5/2015 | Kenney | H10F 77/12 |
| | | | 136/255 |

OTHER PUBLICATIONS

Natarajan, et al., Atomic layer deposition of CuCl nanoparticles, Appl. Phys. Lett. 97, 241905 (2010).*
Xie, et al., Atomic layer deposition of stable LiAlF4 lithium ion conductive interfacial layer for stable cathode cycling, ACS Nano 2017, 11, 7019-7027.*
Hennessy, et al., Atomic Layer Deposition of Lithium Fluoride Optical Coatings for the Ultraviolet, Inorganics 2018, 6, 46.*
G. Natarajan, et al., Atomic layer deposition of CuCl nanoparticles, Appl. Phys. Lett. 97, 241905 (2010).
Georgi Popov et al., Atomic Layer Deposition of PbI2 Thin Films, Chem. Mater. 2019, 31, 1101-1109.
G. Bačić, et al., Designing Stability into Thermally Reactive Plumbylenes, Inorg. Chem. 2018, 57, 8218-8226.
J. Vagott, et al., PbI2 nanocrystal growth bt atomic layer deposition of PB(tmhd)2 and HI (published Chem. Mater. 2022, 34, 6, 2553-2561).
Georgi Popov, Perovskite ternary halides in solar cell applications, E-thesis, Univ. of Helsinki, Faculty of Science, Dept. of Chem., 2014 (Abstract only).

* cited by examiner

*Primary Examiner* — James M Mellott
(74) *Attorney, Agent, or Firm* — Banner & Witcoff, Ltd.

(57) ABSTRACT

The current disclosure relates to a method of depositing a metal halide-comprising material on a substrate by a cyclic deposition process. The method comprises providing a substrate in a reaction chamber, providing a metal precursor into the reaction chamber in a vapor phase and providing a halogen precursor into the reaction chamber in a vapor phase to form the metal halide-comprising material on the substrate. In the method, the metal precursor comprises a metal atom having an oxidation state of +1 bonded to an organic ligand. Also, a deposition assembly for depositing a metal halide-comprising material is disclosed.

17 Claims, 2 Drawing Sheets

VAPOR DEPOSITION PROCESSES AND A DEPOSITION ASSEMBLY

FIELD

The present disclosure relates to methods and deposition assemblies for the manufacture of semiconductor devices. More particularly, the disclosure relates to methods and systems for depositing metal halide-comprising material on a substrate, and layers comprising a metal halide-comprising material. The disclosure also relates to semiconductor device structures comprising metal halide-comprising material deposited by methods disclosed herein.

BACKGROUND

Metal halide thin films have applications in various fields. For example, cesium iodide (CsI) is one of the most studied and applied scintillator materials in imaging detectors, and it is used for indirect X-ray imaging in health care. It can also be used in the manufacture of perovskite solar cells, and it presents a potential material for photocathodes and future solar cell applications. Currently, the production of uniform CsI thin films in large scale remains difficult. Thus, there is need in the art for improved methods of metal halide, such as CsI, thin film formation, as such materials could have application in various technical fields.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

In one aspect, a method of depositing a metal halide-comprising material on a substrate by a cyclic deposition process is disclosed. The method comprises providing a substrate in a reaction chamber, providing a metal precursor into the reaction chamber in a vapor phase and providing a halogen precursor into the reaction chamber in a vapor phase to form the metal halide-comprising material on the substrate. In the method, the metal precursor comprises a metal atom having an oxidation state of +1 bonded to an organic ligand.

In some embodiments, the deposited metal halide is selected from a group consisting of metal chlorides, metal bromides and metal iodides. In some embodiments, the metal of the deposited metal halide is selected from a group consisting of metals of group 1, group 9, group 10, group 11 and group 13 of the periodic table of elements. In some embodiments, the metal of the deposited metal halide is selected from a group consisting of sodium (Na), rubidium (Rb), cesium (Cs), cobalt (Co), rhodium (Rh), iridium (Ir), nickel (Ni), palladium (Pd), platinum (Pt), copper (Cu), silver (Ag), gold (Au), aluminum (Al), thallium (Tl) and indium (In). In some embodiments, the metal of the deposited metal halide is selected from a group consisting of Na, Rb, Cs, Cu, Ag, Au and Tl. In some embodiments, the metal halide-comprising material comprises, consists essentially of, or consists of the deposited metal halide. In some embodiments, the metal of the deposited metal halide has an oxidation state of +1. In some embodiments, the deposited metal halide is selected from a group consisting of NaCl, NaBr, NaI, RbCl, RbBr, RbI, CsCl, CsBr, CsI, CuCl, CuBr, CuI, AgCl, AgBr, AgI, AuCl, AuBr, AuI, TlCl, TlBr, TlI. In some embodiments, the deposited metal halide is selected from a group consisting of NaCl, RbCl, CsCl, CuCl, AgCl, AuCl and TlCl. In some embodiments, the deposited metal halide is selected from a group consisting of NaBr, RbBr, CsBr, CuBr, AgBr, AuBr and TlBr. In some embodiments, the deposited metal halide is selected from a group consisting of NaI, RbI, CsI, CuI, AgI, AuI and TlI. In some embodiments, the deposited metal halide is selected from a group consisting of NaCl, NaBr and NaI. In some embodiments, the deposited metal halide is selected from a group consisting of RbCl, RbBr and RbI. In some embodiments, the deposited metal halide is selected from a group consisting of CsCl, CsBr and CsI. In some embodiments, the deposited metal halide is CsI. In some embodiments, the deposited metal halide is selected from a group consisting of CuCl, CuBr and CuI. In some embodiments, the deposited metal halide is CuI. In some embodiments, the deposited metal halide is selected from a group consisting of AgCl, AgBr and AgI. In some embodiments, the deposited metal halide is selected from a group consisting of AuCl, AuBr and AuI. In some embodiments, the deposited metal halide is selected from a group consisting of TlCl, TlBr and TlI. In some embodiments, the deposited metal halide is selected from a group consisting of $CsPbI_3$, $CsSnI_3$ and $Cs_2SnI_6$.

In embodiments of the current disclosure, the metal atom having an oxidation state of +1 is bound to an organic ligand. In some embodiments, the organic ligand comprises nitrogen. In some embodiments, the organic ligand comprises an amine group. In some embodiments, the metal atom is bonded to the organic ligand through a nitrogen atom. In some embodiments, the organic ligand comprises a silicon-nitrogen bond. In some embodiments, the organic ligand is a silylamine. In some embodiments, the organic ligand comprises oxygen.

In some embodiments, the metal atom is bonded to the ligand through an oxygen atom. In some embodiments, the organic ligand is a C1 to C5 alkoxide. In some embodiments, the organic ligand is a β-diketone. In some embodiments, the organic ligand is selected from a group consisting of tert-butoxy-, acetylacetonato-(acac), bis(trimethylsilyl)amide-(btsa) and trimethylsiloxy-. In some embodiments, the metal precursor is bis(trimethylsilyl)amide cesium.

In some embodiments, the halogen precursor comprises a second metal. In some embodiments, the second metal is deposited on the substrate to form a ternary metal halide.

In embodiments of the current disclosure, the metal precursor reacts with a halogen precursor to produce the deposited metal halide. In some embodiments, halogen of the halogen precursor is selected from a group consisting of Cl, Br and I. In some embodiments, the halogen precursor is selected from a group consisting of $SnI_4$, $SnI_2$, $SnCl_4$, $SnBr_4$, $GeI_4$, $GeI_2$, $PbI_2$, $TiCl_4$, $TiBr_4$, $TiI_4$, $GaCl_3$, $GaBr_3$, $GaI_3$, $AlCl_3$, $AlBr_3$, $AlI_3$.

In some embodiments, the deposition is performed at a temperature below 200° C. In some embodiments, the cyclic deposition process comprises providing the metal precursor and the halogen precursor alternately and sequentially into the reaction chamber. In some embodiments, the reaction chamber is purged between providing the metal precursor and the halogen precursor into the reaction chamber.

In one aspect, a metal halide-containing layer formed by a cyclic deposition process according to the current disclosure is disclosed. In some embodiments, the metal halide-containing layer according to the current disclosure comprises a metal halide selected from a group consisting NaCl, NaBr, NaI, RbCl, RbBr, RbI, CsCl, CsBr, CsI, CuCl, CuBr, CuI, AgCl, AgBr, AgI, AuCl, AuBr, AuI, TlCl, TlBr, TlI. In some embodiments, the metal halide-containing layer according to the current disclosure comprises less than 10 at. % of other elements than metal and halogen.

In another aspect, a semiconductor structure comprising a metal halide-containing layer according to the current disclosure is disclosed.

In a further aspect, semiconductor device comprising a metal halide-containing layer deposited by a cyclic deposition process according to the current disclosure is disclosed.

In yet another aspect, a deposition assembly for depositing a metal halide-comprising material on a substrate is disclosed. The deposition assembly comprises one or more reaction chambers constructed and arranged to hold the substrate, a precursor injector system constructed and arranged to provide a metal precursor and a halogen precursor into the reaction chamber in a vapor phase. The metal precursor comprises a metal atom having an oxidation state of +1 bonded to an organic ligand, the deposition assembly further comprising a precursor vessel constructed and arranged to contain a metal precursor and the assembly is constructed and arranged to provide the metal precursor and the halogen precursor via the precursor injector system to the reaction chamber to deposit metal halide-comprising material on the substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1A:
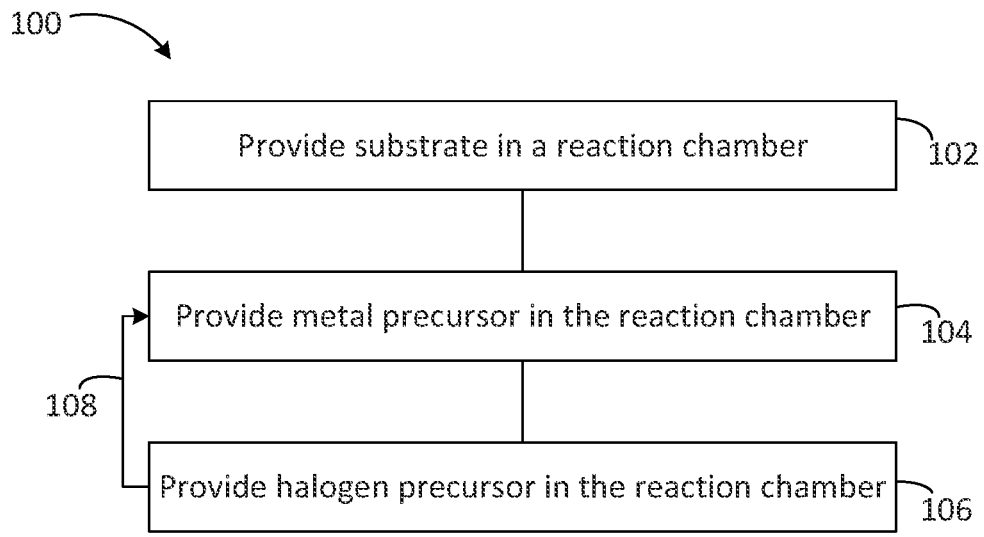
FIGS. 1A and 1B are a block diagrams of exemplary embodiments of a method according to the current disclosure.

The description of exemplary embodiments of methods, layers, structures, devices and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

In the deposition methods according to the current disclosure, metal halide-comprising material is deposited. Thus, the material deposited according to the current disclosure comprises a metal halide. In some embodiments, metal in the deposited metal halide according to the methods disclosed herein has an oxidation state of +1. In some embodiments, the metal has an oxidation state of +1 when present in the metal precursor. However, it is not excluded that a metal precursor used to deposit a metal halide according to the current disclosure comprises a metal having an oxidation state of +2 or +3, for example. It is appreciated that the ligands of the metal precursor are adjusted to accommodate the different oxidation state of the metal.

In some embodiments a binary metal halide, comprising a one metal element and one halogen element is deposited. In some embodiments, a ternary metal halide comprising two metal elements and one halogen element is deposited. The deposition of a ternary metal halide may be performed by reacting deposited binary metal halide, such as CsI, with a halide of another metal, such as lead (Pb) or tin (Sn). For example, $CsPbI_3$, or other fully inorganic ternary metal halide may exhibit higher stability against ambient conditions than $CH_3NH_3PbI_3$ that is currently studied as a ternary perovskite absorber layer.

In some embodiments, a substrate is contacted with a vapor-phase metal precursor, wherein the metal precursor comprises a metal atom with an oxidation state of +1 and an organic ligand. Thereafter, the substrate is contacted with a vapor-phase halogen precursor comprising a halogen selected from Cl, Br and I. The metal precursor and the halogen precursor react with each other to deposit metal halide-comprising material on the substrate. Contacting a substrate with a metal precursor and a halogen precursor may form a deposition cycle resulting in the deposition of metal halide on the substrate. Contacting the substrate with a metal precursor and a halogen precursor may be performed in any order to constitute a deposition cycle.

In some embodiments, the metal halide-comprising material may form a layer. In such embodiments, metal halide forms a metal halide layer. As used herein, a "metal halide layer" can be a material layer that contains metal halide. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous. A layer may be substantially or completely pinhole-free.

Thus, in one aspect, a metal halide-containing layer formed by a cyclic deposition process according to the current disclosure is disclosed. In some embodiments, the metal halide-containing layer according to the current disclosure comprises a metal halide selected from a group consisting of NaCl, NaBr, NaI, RbCl, RbBr, RbI, CsCl, CsBr, CsI, CuCl, CuBr, CuI, AgCl, AgBr, AgI, AuCl, Au Br, AuI, TlCl, TlBr, TlI.

Substrate

As used herein, the term "substrate" may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

Specifically, in photovoltaic applications, a substrate may comprise silicon, category III-V semiconductors, such as antimonides, arsenides, phosphides and nitrides of aluminum, boron, gallium and indium, as well as their combinations, glass, a metal or a combination of metals. Further, a substrate in photovoltaic applications may comprise a coating, such as a transparent polymer, for example, polyethylene terephthalate (PET), a transparent conductive coating or a film, such as $In_2O_3$:Sn (ITO, indium tin oxide), $SnO_2$:F (FTO, fluorine doped tin oxide), ZnO:Al (AZO, aluminum doped zinc oxide) and CuI (copper iodide). Some photovoltaic structures may have a thin insulating film between absorber and underlying structure. Thus, in some embodiments of photovoltaic applications, the substrate may comprise an $Al_2O_3$ and/or a tin oxide film. The substrate may further comprise electron or hole transporting layers, which may be inorganic (for example $TiO_2$, ZnO, NiO, CuSCN, CuI, CuO or $Cu_2O$) or organic: (Phenyl-C61-butyric acid methyl ester (PCBM), 2,2',7,7'-Tetrakis[N,N-di(4-methoxyphenyl)amino]-9,9'-spirobifluorene (Spiro-OMeTAD), poly (3-hexylthiophene-2,5-diyl) (P3HT), Poly[bis(4-phenyl)(2, 4,6-trimethylphenyl)amine (PTAA)].

In imaging applications, a substrate may comprise for example, silicon, metal glass (optionally with a conductive coating such as ITO or FTO above), fiber optic faceplate, carbon (including but not limited to diamond-like carbon), PET or a conductive polymer layer.

In one aspect, a method of depositing a metal halide-comprising material on a substrate by a cyclic deposition process is disclosed. The method comprises providing a substrate in a reaction chamber, providing a metal precursor into the reaction chamber in a vapor phase and providing a halogen precursor into the reaction chamber in a vapor phase to form the metal halide-comprising material on the substrate. In the method, the metal precursor comprises a metal atom having an oxidation state of +1 bonded to an organic ligand.

Vapor Deposition Process

The current disclosure relates to deposition of materials from a vapor phase. Thus, gaseous metal precursor and a halogen precursor are used in the methods according to the current disclosure.

In this disclosure, "gas" can include material that is a gas at normal temperature and pressure (NTP), a vaporized solid and/or a vaporized liquid, and can be constituted by a single gas or a mixture of gases, depending on the context. A metal precursor may be provided to the reaction chamber in gas phase. A halide precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In the current disclosure, the deposition process may comprise a cyclic deposition process, such as an atomic layer deposition (ALD) process or a cyclic chemical vapor deposition (CVD) process. The term "cyclic deposition process" can refer to the sequential introduction of precursor(s) and/or reactant(s) into a reaction chamber to deposit material, such as a metal halide-comprising material, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of a metal precursor and halide precursor may be repeated. In some embodiments, the process comprises or one or more acyclic phases. In some embodiments, the deposition process comprises the continuous flow of at least one precursor. In some embodiments, a reactant may be continuously provided in the reaction chamber. In such an embodiment, the process comprises a continuous flow of a precursor or a reactant. In some embodiments, one or more of the precursors and/or reactants are provided in the reaction chamber continuously. In some embodiments, auxiliary reactant may be provided in the reaction chamber continuously.

The term "atomic layer deposition" (ALD) can refer to a vapor deposition process in which deposition cycles, such as a plurality of consecutive deposition cycles, are conducted in a reaction chamber. Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a metal precursor into the reaction chamber. In some embodiments, the cyclic deposition process comprises purging the reaction chamber after providing a halide precursor into the reaction chamber. In some embodiments, the cyclic deposition process comprises purging the reaction chamber after providing any precursor or reactant into the reaction chamber.

In some embodiments, the methods according to the current disclosure are ALD processes. Thus, in some embodiments, the cyclic deposition process comprises providing the metal precursor and the halogen precursor alternately and sequentially into the reaction chamber. In some embodiments, the reaction chamber is purged between providing the metal precursor and the halogen precursor into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

In some embodiments, the reaction chamber is purged after providing a metal precursor and/or a halide precursor therein. As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used. In the case of spatial purges, a purge step can take the following form: moving a substrate from a first location to which a first precursor is continually supplied, through a purge gas curtain, to a second location to which a second precursor is continually supplied. In some embodiments, the different precursors and/or reactants may be provided in different deposition stations of a multi-station chamber.

In some embodiments, the cyclic deposition process according to the current disclosure comprises a thermal deposition process. In thermal deposition, the chemical reactions are promoted by increased temperature relevant to ambient temperature. Generally, temperature provides the energy needed for the formation of metal halide-comprising material in the absence of other external energy sources, such as plasma, radicals, or other forms of radiation. In some embodiments, the cyclic deposition process according to the current disclosure is a fully thermal process, i.e. it does not comprise plasma steps. However, in some embodiments, the method comprises at least one plasma-enhanced step. In some embodiments, the method according to the current disclosure is a plasma-enhanced deposition method, for example PEALD or PECVD.

In some embodiments, the deposition is performed at a temperature below about 200° C. Without limiting the current disclosure to any specific theory, low deposition temperatures, such as deposition temperatures below 200° C. may be beneficial in achieving continuous and smooth pinhole free films with uniform thickness.

In some embodiments, the deposition is performed at a temperature below about 175° C. In some embodiments, the deposition is performed at a temperature below about 150° C. In some embodiments, the deposition is performed at a temperature between about 100° C. and about 350° C., such as at about 125° C., about 150° C., about 180° C., about 200° C., about 220° C. or about 250° C.

A deposition process according to the current may be performed at a reduced pressure. In some embodiments, a pressure in the reaction chamber may be lower than about 300 Torr, lower than about 100 Torr, lower than about 50 Torr, lower than about 20 Torr lower than about 10 Torr, or lower than about 5 Torr. In some embodiments, a pressure in the reaction chamber is between about 5 and 10 Torr, between about 5 and 30 Torr, between about 5 and about 50 Torr, or between about 5 and about 100 Torr.

In some embodiments, the growth rate of the metal halide-comprising material, measured as growth per cycle (gpc) may be, for example, at least 0.5 Å/cycle, such as at least 1 Å/cycle, at least 2 Å/cycle or at least 3 Å/cycle. Various process parameters, for example deposition temperature and precursor dosing (such as their pulsing time) may affect the growth rate in a given situation.

Precursors

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may be an element or a compound that is not incorporated into the resulting compound or element to a significant extent. However, a reactant may also contribute to the resulting compound or element in certain embodiments, or it may modify the properties of the deposited material.

As used herein, "a metal precursor" includes a gas or a material that can become gaseous and that can be represented by a chemical formula that includes the metal to be incorporated into the deposited metal halide. In some embodiments, metal of the metal precursor is selected from a group consisting of metals of group 1, group 9, group 10, group 11 and group 13 of the periodic table of elements. In some embodiments, the metal of the metal precursor is selected from a group consisting of sodium (Na), rubidium (Rb), cesium (Cs), cobalt (Co), rhodium (Rh), iridium (Ir), nickel (Ni), palladium (Pd), platinum (Pt), copper (Cu), silver (Ag), gold (Au), aluminum (Al), indium (In) and thallium (Tl). In some embodiments, the metal of the metal precursor is selected from a group consisting of Na, Rb, Cs, Cu, Ag, Au and Tl.

In some embodiments, the metal precursor is a metal organic precursor or an organometallic precursor. Many different classes of such precursors are used in the art of cyclic vapor deposition. The precursor should be gaseous in a suitable temperature and pressure to allow the deposition according to the current disclosure. In some embodiments, the organic ligand is selected from a group consisting of tert-butoxy-, acetylacetonato-(acac)), bis(trimethylsilyl)amide-(btsa) and trimethylsiloxy-.

In some embodiments of the current disclosure, the metal atom having an oxidation state of +1 is bound to an organic ligand. In some embodiments, the organic ligand comprises nitrogen. In some embodiments, the organic ligand comprises an amine group. In some embodiments, the metal atom is bonded to the organic ligand through a nitrogen atom. In some embodiments, the organic ligand is represented by formula-N—R$_2$, wherein each R is independently selected from linear or branched alkyl groups, cyclic alkyl groups and aromatic groups. An alkyl group may comprise one, two, three, four, five or six carbon atoms. For example, the alkyl group may be an n-propyl group or an iso-propyl group. Further, the alkyl substituent may be an n-, iso-, tert- or sec-form of a butyl, pentyl or hexyl group. In some embodiments, both of the organic groups bonded to the metal atom are alkyl groups. However, in some embodiments, the alkyl groups are not aromatic alkyl groups. In some embodiments, the alkyl groups are not cyclic alkyl groups. In some embodiments, both R are the same. In some embodiments, all R are methyl. In some embodiments, one R is methyl. In some embodiments, both of R are methyl.

In some embodiments, the organic ligand comprises a silicon-nitrogen bond. In some embodiments, the organic ligand is a silylamine. In some embodiments, the metal precursor comprises an organic ligand represented by formula-N(SiR$_3$)$_2$, wherein each R is independently selected from the alkyls listed above. In some embodiments, all R are the same. In some embodiments, all R are methyl. In some embodiments, one R is methyl. In some embodiments, two of R are methyl. In some embodiments, the metal precursor is bis(trimethylsilyl)amide cesium.

In some embodiments, the organic ligand comprises oxygen. In some embodiments, the metal atom is bonded to the ligand through an oxygen atom. In some embodiments, the organic ligand is a C1 to C5 alkoxide. Thus, the organic ligand may be represented by a formula —O—R, wherein each R is independently selected as above. In some embodiments, the organic ligand is O—C(CH$_3$)$_3$.

In some embodiments, the organic ligand comprises a siloxy group. In some embodiments, the organic ligand may be represented by a formula —O—SiR$_3$, wherein each R is independently selected from alkyls listed above. In some embodiments, the metal precursor is trimethylsiloxy cesium.

In some embodiments, the organic ligand is a β-diketone. In some embodiments, the organic ligand is acac. In some embodiments, the metal precursor is acetylacetonato cesium.

In some embodiments, the metal precursor comprises a metal atom with an oxidation state of +2. In some embodiments, the metal precursor is provided in a mixture of two or more compounds. In a mixture, the other compounds in addition to the metal precursor may be inert compounds or elements. In some embodiments, the metal precursor is provided in a composition. Compositions suitable for use as composition can include a metal compound and an effective amount of one or more stabilizing agents. Composition may be a solid, liquid or a gas under standard conditions.

In embodiments according to the current disclosure, the metal precursor reacts with a halogen precursor to form a metal halide on the substrate. As used herein, "a halogen precursor" includes a gas or a material that can become gaseous and that can be represented by a chemical formula that includes the halogen to be incorporated into the deposited metal halide. In some embodiments, halogen of the halogen precursor is selected from a group consisting of chlorine (Cl), bromine (Br) and iodine (I). In some embodiments, the halogen precursor is selected from a group consisting of SnI$_4$, SnI$_2$, SnCl$_4$, SnBr$_4$, GeI$_4$, GeI$_2$, PbI$_2$, TiCl$_4$, TiBr$_4$, TiI$_4$, GaCl$_3$, GaBr$_3$, GaI$_3$, AlCl$_3$, AlBr$_3$, AlI$_3$, SbCl$_5$ and SbCl$_3$. In some embodiments, the halogen precursor is a volatile transition metal halide, such as VCl$_4$ or MoCl$_5$. In some embodiments, the halogen precursor is a volatile transition metal oxyhalide, such as MoO$_2$Cl$_2$ or VOCl$_3$.

In some embodiments, the halogen precursor is an organic halogen compound. In some embodiments, the halogen precursor is selected from a group consisting of alkyl halides, aryl halides, dihalogen molecules, hydrohalogen molecules, acyl halides, halosilanes, thionyl halides, phosphorus-halogen bond-containing molecules and nitrogen-halogen bond-containing molecules.

In some embodiments, the alkyl halide is selected from a group consisting of alkyl chlorides, alkyl bromides and alkyl iodides. In some embodiments, the alkyl halide is selected from a group consisting of 1,1-dichloroalkanes, 1,2-dichloroalkanes, 1,1-dibromoalkanes, 1,2-dibromoalkanes, 1,1-diiodoalkanes, and 1,2-diiodoalkanes. In some embodiments, the aryl halide is selected from aryl chlorides, aryl bromides and aryl iodides. In some embodiments, the aryl halide is selected from a group consisting of chlorobenzene, bromobenzene and iodobenzene. An aryl halide according to the current disclosure may comprise one, two, three, four, five, or six halogen atoms. In some embodiments, all halogens are the same halogen. In some embodiments, the aryl halide comprises one iodine atom. An exemplary aryl iodide includes iodobenzene. In some embodiments, the aryl halide comprises two iodine atoms. An exemplary aryl iodide includes diiodobenzene. In some embodiments, the aryl halide comprises one chlorine atom. An exemplary aryl chloride includes chlorobenzene. In some embodiments, the aryl halide comprises two chlorine atoms. An exemplary aryl chloride includes dichlorobenzene. In some embodiments, the aryl halide comprises one bromine atom. An exemplary aryl bromide includes bromobenzene. In some embodiments, the aryl halide comprises two bromine atoms. An exemplary aryl bromide includes dibromobenzene.

In some embodiments, the halogen precursor is a dihalogen molecule, such as Cl$_2$, Br$_2$, I$_2$, Cl—Br, Cl—I or Br—I. In some embodiments, the halogen precursor is a hydrohalogen molecule, such as HBr, HI or HCl. In some embodiments, the halogen precursor comprises a C—Cl bond, a C—Br bond or a C—I bond. In some embodiments, the halogen precursor is an acyl halide, such as an acyl chloride, acyl bromide or an acyl iodide, including oxalyl chloride, oxalyl bromide and oxalyl iodide. In some embodiments, the halogen precursor is a diacyl halide, including bifunctional acyl halides, i.e. diacid halides, such as oxalyl chloride, malonyl chloride, oxalyl bromide, malonyl bromide, oxalyl iodide and malonyl iodide.

In some embodiments, the halogen precursor is a halosilane, such as a monohalosilane, dihalosilane or a trihalosilane. In some embodiments, the halogen precursor is a chlorosilane, bromosilane or a iodosilane. In some embodiments, a halosilane comprises one halogen atom. In some embodiments, a halosilane comprises two halogen atoms. In some embodiments, a halosilane comprises three halgoen atoms. Exemplary halosilanes include $SiCl_4$, $SiBr_4$, $SiI_4$, $SiH_2Br_2$, $SiH_3I$, $SiH_2I_2$ and $SiHI_3$, and $SiI_4$. In some embodiments, the halogen reactant comprises an alkylsilyl halide, such as trimethylsilyl iodide ($SiMe_3I$).

In some embodiments, the halogen precursor comprises a S—Cl bond, a S—Br bond or a S—I bond. In some embodiments, the halogen precursor comprises a thionyl halide, such as a thionyl chloride, thionyl bromide or a thionyl iodide. In some embodiments, the halogen precursor comprises molecules comprising a phosphorus-halide bond, such as a P—Cl, P—Br or P—I bond. Examples of such molecules include $PCl_3$, $PCl_5$, $PBr_3$, $PBr_5$, $POCl_3$, $POBr_3$, and $POI_3$. In some embodiments, the halogen precursor comprises molecules comprising a nitrogen-halide bond, such as a N—Cl, N—Br or N—I bond. Examples of such molecules include N-bromosuccinimide and N-iodosuccinimide.

In some embodiments, the halogen precursor comprises an O—Cl bond, an O—Br bond or an O—I bond. In some embodiments, the halogen precursor is an alkyl hypochlorite. In some embodiments, the halogen precursor is tert-butyl hypochlorite. In some embodiments, the halogen precursor is an alkyl hypobromite, such as tert-butyl hypobromite. In some embodiments, the halogen precursor is an alkyl hypoiodite, for example tert-butyl hypoiodite.

Further, in some embodiments, the halogen precursor is a volatile halogen salt. The halogen precursor may be a salt of chloride, bromide or iodide, for example ammonium chloride, ammonium bromide, ammonium iodide, pyridinium chloride, pyridinium bromide, or pyridinium iodide.

Without limiting the current disclosure to any specific theory, the halogen precursor may react with the metal precursor chemisorbed on the substrate surface. Similarly, the metal precursor may react with the halogen precursor chemisorbed on the substrate surface. In some embodiments, the halogen precursor is a metal halide. Thus, in some embodiments, the halogen precursor comprises a second metal. The second metal of the halogen precursor is selected so that the reaction between the metal precursor and the halogen precursor leads into the formation of a new metal halide, containing the metal of the metal precursor and the halogen of the halogen precursor. Further, the newly formed metal halide should be non-gaseous under the given process conditions to allow its deposition on the substrate surface.

In some embodiments, the second metal is deposited on the substrate to form a ternary metal halide. However, in some embodiments, deposition of ternary metal halide is performed by separately depositing another metal halide on the metal halide deposited according to the current disclosure.

Deposited Material

In some embodiments, the deposited metal halide is selected from a group consisting of metal chlorides, metal bromides and metal iodides. In some embodiments, the metal of the deposited metal halide is selected from a group consisting of metals of group 1, group 9, group 10, group 11 and group 13 of the periodic table of elements. In some embodiments, the metal of the deposited metal halide is selected from a group consisting of sodium (Na), rubidium (Rb), cesium (Cs), cobalt (Co), rhodium (Rh), iridium (Ir), nickel (Ni), palladium (Pd), platinum (Pt), copper (Cu), silver (Ag), gold (Au), aluminum (Al), indium (In) and thallium (Tl). In some embodiments, the metal of the deposited metal halide is selected from a group consisting of Na, Rb, Cs, Cu, Ag, Au and Tl. In some embodiments, the metal halide-comprising material comprises, consists essentially of, or consists of the deposited metal halide. In some embodiments, the deposited metal halide is selected from a group consisting of NaCl, NaBr, NaI, RbCl, RbBr, RbI, CsCl, CsBr, CsI, CuCl, CuBr, CuI, AgCl, AgBr, AgI, AuCl, AuBr, AuI, TlCl, TlBr, TlI.

For the deposition to be successful, the deposited metal halide should have low enough rate of vaporization under the deposition conditions. Thus, volatility of the deposited material has to be taken into account when selecting the process parameters for a given material.

The elemental composition of metal halide-comprising material deposited according to the current disclosure may vary, depending on the process. In some embodiments, a metal halide-comprising material may comprise, for example, at least about 60 atomic percentage (at. %) of the metal halide, or at least about 75 at. % of the metal halide, or from about 75 to about 95 at. % of the metal halide, or from about 75 to about 89 at. % of the metal halide. A metal halide-comprising material deposited by a method according to the current disclosure may comprise, for example at least about 80 at. %, about 85 at. %, about 87 at. %, about 90 at. %, about 95 at. %, about 97 at. % or about 99 at. % of the metal halide. In some embodiments, a metal halide-comprising material may consist essentially of, or consist of the metal halide. Material consisting of metal halide may include an acceptable amount of impurities, such as oxygen, carbon, chlorine or other halogen and/or hydrogen that may originate from one or more precursors used to deposit the metal halide-comprising material. In some embodiments, the material deposited according to the current disclosure comprises at least one more element in addition to the metal halide.

In some embodiments, the metal halide-comprising material may comprise less than about 5 at. %, less than about 3 at. %, less than about 1 at. %, or less than about 0.5 at. % nitrogen. In some embodiments, the metal halide-comprising material may comprise less than about 10 at. %, less than about 5 at. %, less than about 1 at. %, or less than about 0.5 at. % carbon. In some embodiments, the metal halide-comprising material may comprise less than about 10 at. %, less than about 5 at. %, less than about 3 at. %, or less than about 1 at. % hydrogen. In some embodiments, the metal halide-comprising material may comprise less than about 15 at. %, less than about 10 at. %, less than about 5 at. %, less than about 3 at. %, or less than about 2 at. % oxygen. In some embodiments, the metal halide-containing layer according to the current disclosure comprises less than about 10 at. %, less than about 5 at. % or less than about 3 at. % of other elements than metal and halogen.

In some embodiments, a metal halide deposited according to the current disclosure is combined on the surface of a substrate with another material to form a ternary halide. Such ternary halides may form a perovskite structure. In some embodiments, such a ternary halide may be represented by a formula $ABX_3$, wherein A is selected from Cs and Rb, B is selected from Sn and Pb, and X is selected from Cl, Br and I. Further, in some embodiments, the ternary halides formed by combining a metal halide deposited according to the current disclosure with another material may be represented by a formula $A_3C_2X_9$, wherein A is selected from Cs and Rb, C is selected from Bi and Sb, and X is selected from Cl, Br and I. In some embodiments, the ternary halide is a ternary metal halide. In some embodiments, the ternary halide is formed by combining a metal halide deposited according to the current disclosure with another metal halide. In some embodiments, the ternary metal halide is selected from a group consisting of $CsPbI_3$, $CsSnI_3$ and $Cs_2SnI_6$. In some embodiments, a perovskite may comprise, consist essentially of, or consist of a solid solution or a mixture of the above ternary halides.

A metal halide-containing material, and a layer formed thereof can be used to form semiconductor structures, and further semiconductor devices. Thus, in one aspect, a semiconductor structure comprising a metal halide-containing layer according to the current disclosure is disclosed. In a further aspect, semiconductor device comprising a metal halide-containing layer deposited by a cyclic deposition process according to the current disclosure is disclosed.

A metal halide according to the current disclosure may be deposited on a substrate in a deposition assembly as described herein. The deposition assembly may be configured and arranged to perform one or more additional deposition processes. In yet another aspect, a deposition assembly for depositing a metal halide-comprising material on a substrate is disclosed. The deposition assembly comprises one or more reaction chambers constructed and arranged to hold the substrate, a precursor injector system constructed and arranged to provide a metal precursor and a halogen precursor into the reaction chamber in a vapor phase. The metal precursor comprises a metal atom having an oxidation state of +1 bonded to an organic ligand, the deposition assembly further comprising a precursor vessel constructed and arranged to contain a metal precursor and the assembly is constructed and arranged to provide the metal precursor and the halogen precursor via the precursor injector system to the reaction chamber to deposit metal halide-comprising material on the substrate.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

Figure 1B:
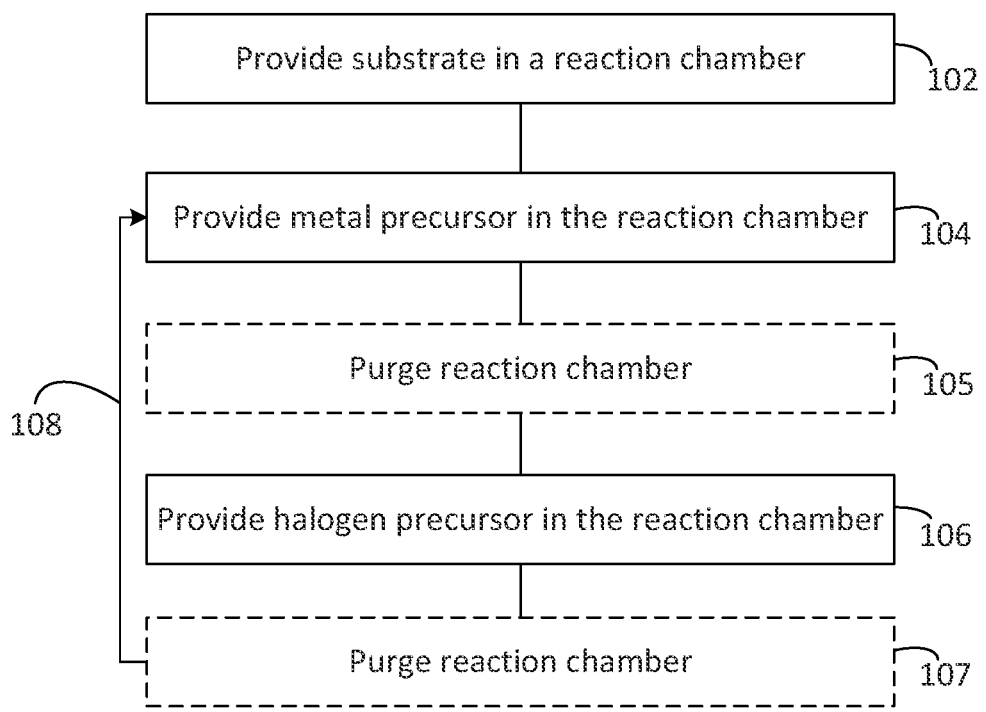

FIGS. 1A and 1B are a block diagrams of an exemplary embodiment of a method 100.

In the first phase 102, a substrate is provided into a reaction chamber. A substrate according to the current disclosure may comprise, for example, an oxide, such as silicon oxide (for example thermal silicon oxide or native silicon oxide), aluminum oxide, or a transition metal oxide, such as hafnium oxide. A substrate may comprise a nitride, such as silicon nitride or titanium nitride, a metal, such as copper, cobalt or tungsten, chalcogenide material, such as molybdenum sulfide. The deposited metal halide-comprising material may form layers that can be used in the manufacture of electronic devices. A metal halide deposited according to the current disclosure may be used in the manufacture of photovoltaic devices. A metal halide deposited according to the current disclosure may be used in the manufacture of imaging structures. Depending on the application in question, the layer properties may differ. For example, layers of different thicknesses may be deposited. Also, the metal halide-comprising material may be doped with another material, either a metal, semimetal or a non-metal to amend its properties.

The reaction chamber can form part of an atomic layer deposition (ALD) assembly. The reaction chamber can form part of a chemical vapor deposition (CVD) assembly. The assembly may be a single wafer reactor. Alternatively, the reactor may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The metal halide-comprising material according to the current disclosure may be deposited in a cross-flow reaction chamber. The metal halide-comprising material according to the current disclosure may be deposited in a cross-flow reaction chamber or in a shower head-type reaction chamber.

A metal precursor is provided in the reaction chamber containing the substrate at phase 104. Without limiting the current disclosure to any specific theory, metal precursor may chemisorb on the substrate during providing metal precursor into the reaction chamber. The duration of providing metal precursor into the reaction chamber (metal precursor pulse time) may be, for example, from about 0.1 to about 15 seconds, from about 0.5 to about 10 seconds, from about 0.5 to about 5 seconds, or from about 0.5 to about 3 seconds. For example, the metal precursor pulse time may be about 0.5 seconds, 1 second, 1.5 seconds, 2 seconds, 3 seconds, 3.5 seconds, 5 seconds, 7 seconds, or 10 seconds. In some embodiments, the metal precursor pulse time may be shorter than 25 s, shorter than 15 s, shorter than 8 s, shorter than 5 s, or shorter than 2 s. The duration depends on the precursor used, and on the application, for example. In some embodiments, a saturating pulsing is used. In some embodiments, a non-saturating pulsing regime is used.

When halogen precursor is provided in the reaction chamber at phase 106, it may react with the chemisorbed metal precursor, or its derivate species, to form a metal halide. The duration of providing halogen precursor in the reaction chamber (halogen precursor pulse time) may be, for example, from about 0.1 to about 15 seconds, from about 0.5 to about 10 seconds, from about 0.5 to about 5 seconds, or from about 0.5 to about 3 seconds. The duration depends on the halogen precursor, the metal precursor used, and on the application, for example. In some embodiments, the halogen precursor pulse time may be shorter than 25 s, shorter than 15 s, shorter than 8 s, shorter than 5 s, or shorter than 2 s.

In some embodiments, metal precursor is heated before providing it into the reaction chamber. In some embodiments, halogen precursor is heated before providing it to the reaction chamber. In some embodiments, the metal precursor is kept in ambient temperature before providing it to the reaction chamber. In some embodiments, the halogen precursor is kept in ambient temperature before providing it to the reaction chamber.

Phases 104 and 106, performed in any order, may form a deposition cycle, resulting in the deposition of metal halide-comprising material on the substrate surface. In some embodiments, the two phases of metal halide-comprising material deposition, namely providing the metal precursor and the halogen precursor in the reaction chamber (104 and 106), may be repeated (loop 108). Such embodiments contain several deposition cycles. The thickness of the deposited metal halide-comprising material may be regulated by adjusting the number of deposition cycles. The deposition cycle (loop 108) may be repeated until a desired transition metal halide-comprising material thickness is achieved. For example, about 50, 100, 200, 300, 400, 500, 700, 800, 1,000, 1,200, 1,500 or 2,000 deposition cycles may be performed.

FIG. 1B illustrates a similar deposition process as described above. In FIG. 1B, the process comprises optionally purging the reaction chamber after providing a metal precursor in the reaction chamber 105, and after providing a halogen precursor in the reaction chamber 107. However, in some embodiments, only one of the purge phases 105 and 107 is performed. In some embodiments, both purge phases 105 and 107 are performed. The duration of the purge phase 105 and 107 may be the same or different. The selection of an appropriate purge phase length depends on the metal precursor and halogen precursor properties, as well as on the substrate topology, as well as on other parameters of the deposition process.

In exemplary deposition experiments, CsI was deposited at temperatures between 140° C. and 350° C. Molecular nitrogen was used as a carrier gas and as a purging gas, and the method was performed at a pressure below 20 Torr. $CsN(Si(CH_3)_3)_2$ was used as the metal precursor, and $SnI_4$ as the halogen precursor. Both precursors were solid, and they were heated to volatilize them sufficiently. The metal precursor was heated to temperatures between 100 and 150° C., whereas the halogen precursor was sublimed at temperatures below 100° C. The metal precursor pulse time was 1.5 seconds, the halogen precursor pulse time was 0.5 seconds, with a purge time of 1 second in between. At deposition temperatures between about 150° C. and 170° C., the growth rate saturates with respect to both precursor pulse lengths and is independent of the purge length. With these parameters, the thickness of the deposited CsI was linearly dependent on the number of applied deposition cycles, such that 100 deposition cycles produced a material layer of about 30 nm in thickness, 200 cycles a layer of about 70 nm, 300 cycles about 100 nm, and 400 cycles a layer of about 130 nm in thickness. Thus, growth rate of more than 3 Å/cycle was observed. The deposited material was phase pure crystalline CsI at all examined deposition temperatures (such as 150° C., 190° C., 210° C., 250° C., 300° C. and 350° C.). At deposition temperatures below 180° C., material formed columnar crystallites, was continuous, uniform and substantially pinhole free. According to reflectivity measurements the refractive indices of these films were 1.8 at 580 nm. Composition of the deposited material was evaluated with EDS and TOF-ERDA using the layers deposited at 150° C. with 400 cycles, 1.5 s metal precursor pulse, 0.5 s halogen precursor pulse and 1.0 s purge. According to the EDS measurement, Cs:I ratio was about 1:1 and no second metal from the halogen precursor was detected. The material contained 4.3 at. % of impurities. 0.3 at. % N, 0.7 at. % C, 1.2 at. % H and 2.1 at. % O were detected. As CsI is hygroscopic, the detected impurities may largely be explained by a short exposure to ambient air during sample preparation and handling.

Figure 2:
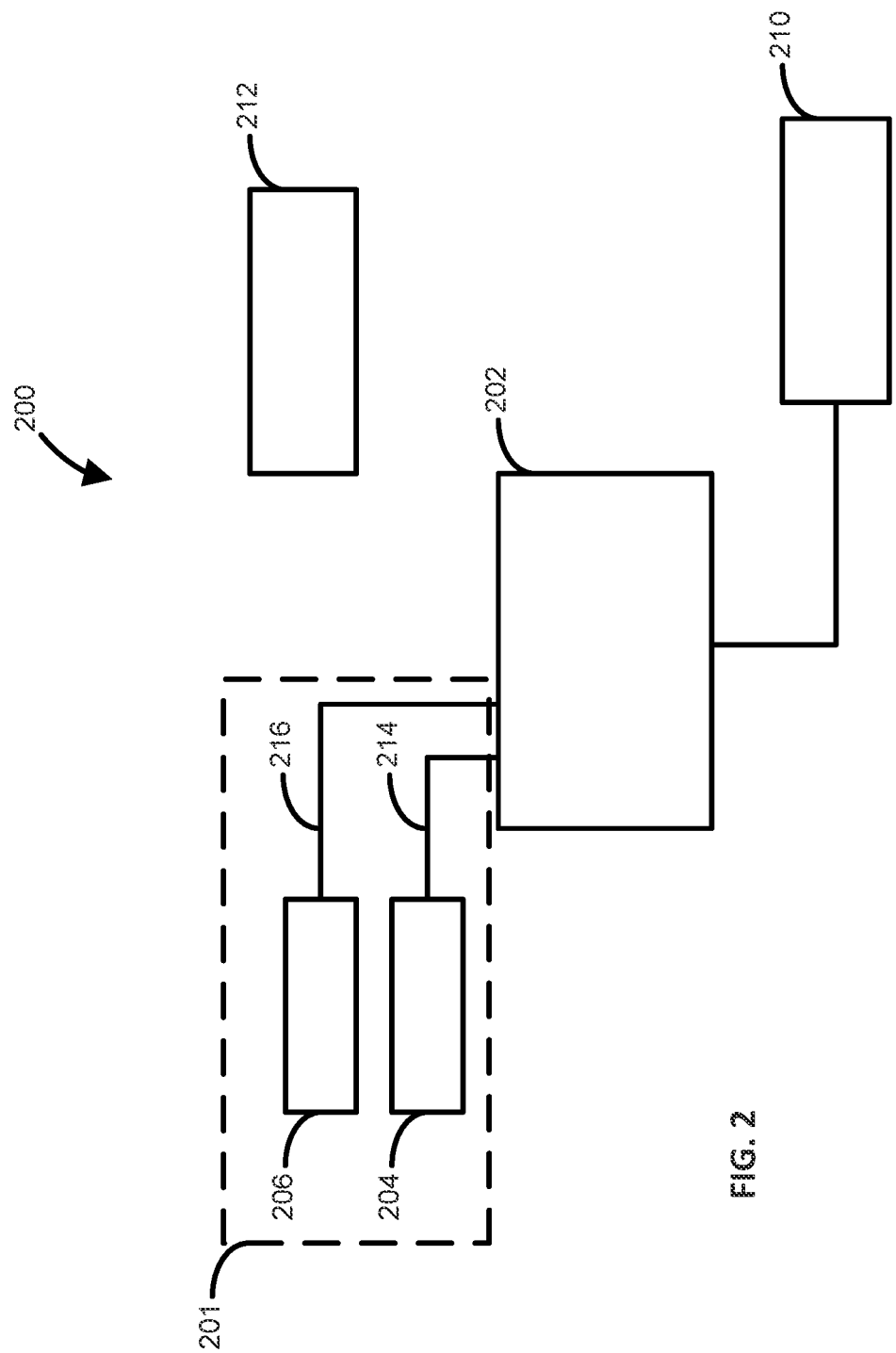
FIG. 2 is a schematic presentation of a deposition assembly according to the current disclosure.

FIG. 2 illustrates a deposition assembly 200 according to the current disclosure in a schematic manner. Deposition assembly 200 can be used to perform a method as described herein and/or to form a layer, a structure or a device, or a portion thereof as described herein.

In the illustrated example, deposition assembly 200 includes one or more reaction chambers 202, a precursor injector system 201, a metal precursor vessel 204, a halogen precursor vessel 206, an exhaust source 210, and a controller 212. The deposition assembly 200 may comprise one or more additional gas sources (not shown), such as an inert gas source, a carrier gas source and/or a purge gas source. Also, in case materials comprising additional elements are deposited, the deposition assembly may further comprise additional precursor and/or reactant vessels.

Reaction chamber 202 can include any suitable reaction chamber, such as an ALD or CVD reaction chamber as described herein.

The metal precursor vessel 204 can include a vessel and one or more metal precursors as described herein—alone or mixed with one or more carrier (e.g., inert) gases. A halogen precursor vessel 206 can include a vessel and a halogen precursor as described herein—alone or mixed with one or more carrier gases. Although illustrated with two source vessels 204 and 206, deposition assembly 200 can include any suitable number of source vessels. Source vessels 204 and 206 can be coupled to reaction chamber 202 via lines 214 and 216, which can each include flow controllers, valves, heaters, and the like. In some embodiments, the metal precursor in the metal or semimetal precursor vessel 204 and/or the halogen precursor in the halogen precursor vessel 206 may be heated. In some embodiments, the temperature of the metal precursor vessel is regulated so that it is below about 200° C., such as between 80° C. and about 200° C. In some embodiments, the temperature of the halogen precursor vessel is regulated so that it is below 180° C., such as between 50° C. and about 100° C.

Exhaust source 210 can include one or more vacuum pumps.

Controller 212 includes electronic circuitry and software to selectively operate valves, manifolds, heaters, pumps and other components included in the deposition assembly 200. Such circuitry and components operate to introduce precursors, other optional reactants and purge gases from the respective sources. Controller 212 can control timing of gas pulse sequences, temperature of the substrate and/or reaction chamber 202, pressure within the reaction chamber 202, and various other operations to provide proper operation of the deposition assembly 200. Controller 212 can include control software to electrically or pneumatically control valves to control flow of precursors, reactants and purge gases into and out of the reaction chamber 202. Controller 212 can include modules such as a software or hardware component, which performs certain tasks. A module may be configured to reside on the addressable storage medium of the control system and be configured to execute one or more processes.

Other configurations of deposition assembly 200 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 202. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 200, substrates, such as semiconductor wafers (not illustrated), are transferred from, e.g., a substrate handling system to reaction chamber 202. Once substrate(s) are transferred to reaction chamber 202, one or more gases from gas sources, such as precursors, other optional reactants, carrier gases, and/or purge gases, are introduced into reaction chamber 202.

In some embodiments, a metal precursor is supplied in pulses, a halogen precursor is supplied in pulses and the reaction chamber is purged between consecutive pulses of metal precursor and a halogen precursor.

The invention claimed is:

1. A method of depositing a cesium halide-comprising material on a substrate by a cyclic deposition process, the method comprising:
   providing the substrate in a reaction chamber;
   providing a cesium precursor into the reaction chamber in a vapor phase; and
   providing a halogen precursor into the reaction chamber in a vapor phase to form the cesium halide-comprising material on the substrate,
   wherein the cesium precursor comprises a cesium atom having an oxidation state of +1 bonded to an organic ligand.

2. The method of claim 1, wherein the deposited cesium halide-comprising material is selected from a group consisting of cesium chlorides, cesium bromides, and cesium iodides.

3. The method of claim 1, wherein the deposited cesium halide-comprising material comprises a second metal selected from a group consisting of metals of group 1, group 9, group 10, group 11 and group 13 of the periodic table of elements.

4. The method of claim 1, wherein the deposited cesium halide-comprising material comprises a second metal selected from a group consisting of Na, Rb, Co, Rh, Ir, Ni, Pd, Pt, Cu, Ag, Au, Al, In, and Tl.

5. The method of claim 1, wherein the deposited cesium halide-comprising material is selected from a group consisting of CsCl, CsBr, and CsI.

6. The method of claim 1, wherein the cesium halide-comprising material is selected from a group consisting of CsPbI3, CsSnI3 and Cs2SnI6.

7. The method of claim 1, wherein the organic ligand comprises nitrogen.

8. The method of claim 7, wherein the organic ligand comprises a silicon-nitrogen bond.

9. The method of claim 8, wherein the organic ligand is a silylamine.

10. The method of claim 1, wherein the organic ligand comprises oxygen.

11. The method of claim 10, wherein the organic ligand is a C1 to C5 alkoxide.

12. The method of claim 10, wherein the organic ligand is a β-diketone.

13. The method of claim 1, wherein the organic ligand is selected from a group consisting of tert-butoxy-, acetylacetonato-(acac), bis(trimethylsilyl)amide (btsa)-, and trimethylsiloxy-.

14. The method according to claim 1, wherein the cesium precursor is bis(trimethylsilyl)amide cesium.

15. The method of claim 1, wherein a second metal is deposited on the substrate to form a ternary metal halide.

16. The method of claim 1, wherein the cyclic deposition process is performed at a temperature below 200° C.

17. The method of claim 1, wherein the cyclic deposition process comprises providing the cesium precursor and the halogen precursor alternately and sequentially into the reaction chamber.

* * * * *